(12) United States Patent
Markert et al.

(10) Patent No.: US 6,882,554 B2
(45) Date of Patent: Apr. 19, 2005

(54) INTEGRATED MEMORY, AND A METHOD OF OPERATING AN INTEGRATED MEMORY

(75) Inventors: Michael Markert, Augsburg (DE); Christian Weis, Germering (DE); Sabine Kieser, Hausham (DE); Stefan Dietrich, Türkenfeld (DE); Peter Schrögmeier, München (DE); Thomas Hein, München (DE)

(73) Assignee: Infineon Technologies AG, Munich (DE)

(*) Notice: Subject to any disclaimer, the term of this patent is extended or adjusted under 35 U.S.C. 154(b) by 200 days.

(21) Appl. No.: 10/287,501

(22) Filed: Nov. 4, 2002

(65) Prior Publication Data

US 2003/0107910 A1 Jun. 12, 2003

(30) Foreign Application Priority Data

Nov. 2, 2001 (DE) .......................... 101 54 066

(51) Int. Cl.$^7$ ................................. G11C 5/06
(52) U.S. Cl. ................ 365/63; 365/189.01; 365/230.03
(58) Field of Search ............................. 365/63, 189.01, 365/230.03, 230.09, 221, 51, 238.5, 206–208, 189.04, 230.06

(56) References Cited

U.S. PATENT DOCUMENTS

| | | | |
|---|---|---|---|
| 5,579,280 A | * 11/1996 | Son et al. ................. 365/238.5 |
| 5,699,300 A | * 12/1997 | Akamatsu et al. ...... 365/189.04 |
| 5,703,822 A | * 12/1997 | Ikeda .......................... 365/221 |
| 6,163,498 A | * 12/2000 | Moon ..................... 365/230.06 |
| 6,314,035 B1 | * 11/2001 | Kitade et al. ............... 365/201 |
| 2001/0026498 A1 | * 10/2001 | Dietrich et al. ......... 365/230.03 |

OTHER PUBLICATIONS

Itoh, K. et al.: "Limitations and Challenges of Multigigabit DRAM Chip Design", IEEE Journal of Solid State Circuits, vol. 32, No. 5, May 1997, pp. 624–634.

* cited by examiner

Primary Examiner—Michael S. Lebentritt
Assistant Examiner—Dang T Nguyen
(74) Attorney, Agent, or Firm—Laurence A. Greenberg; Werner H. Stemer; Ralph E. Locher

(57) ABSTRACT

An integrated memory has row lines, column lines and column selection lines for activating read/write amplifiers. In each case, one group of a predetermined number of memory cells belongs to a row and a column address. Furthermore, the memory has a number of connecting pads corresponding to the predetermined number. Each memory cell in a group of memory cells is associated with one of the connecting pads. A control circuit for controlling the memory access is designed and can be operated such that, with a column address, it activates at least two different column selection lines. One of the column selection lines is activated for two or more column addresses. The delay times and the line lengths on the memory chip can thus be reduced in size.

12 Claims, 3 Drawing Sheets

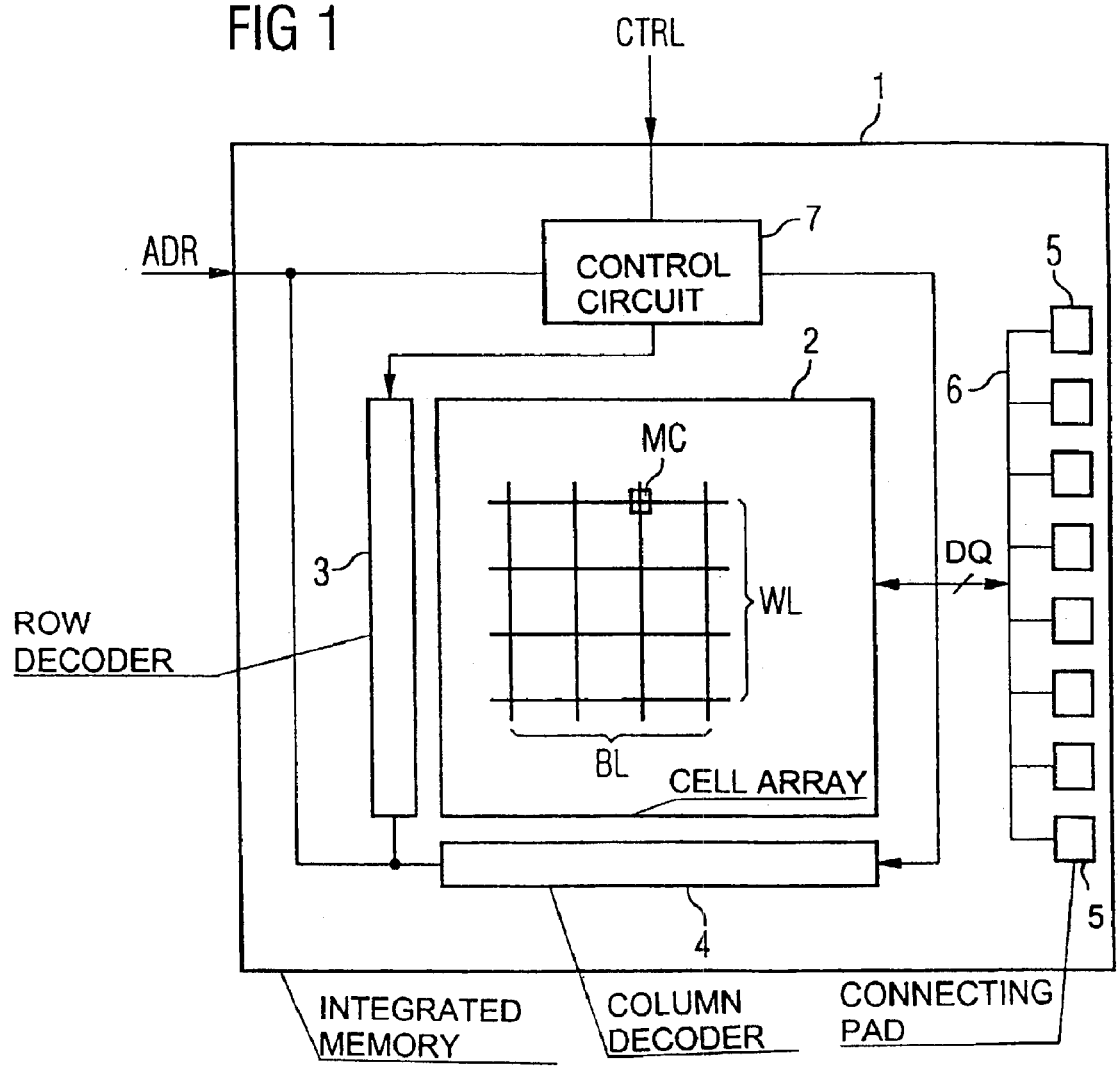

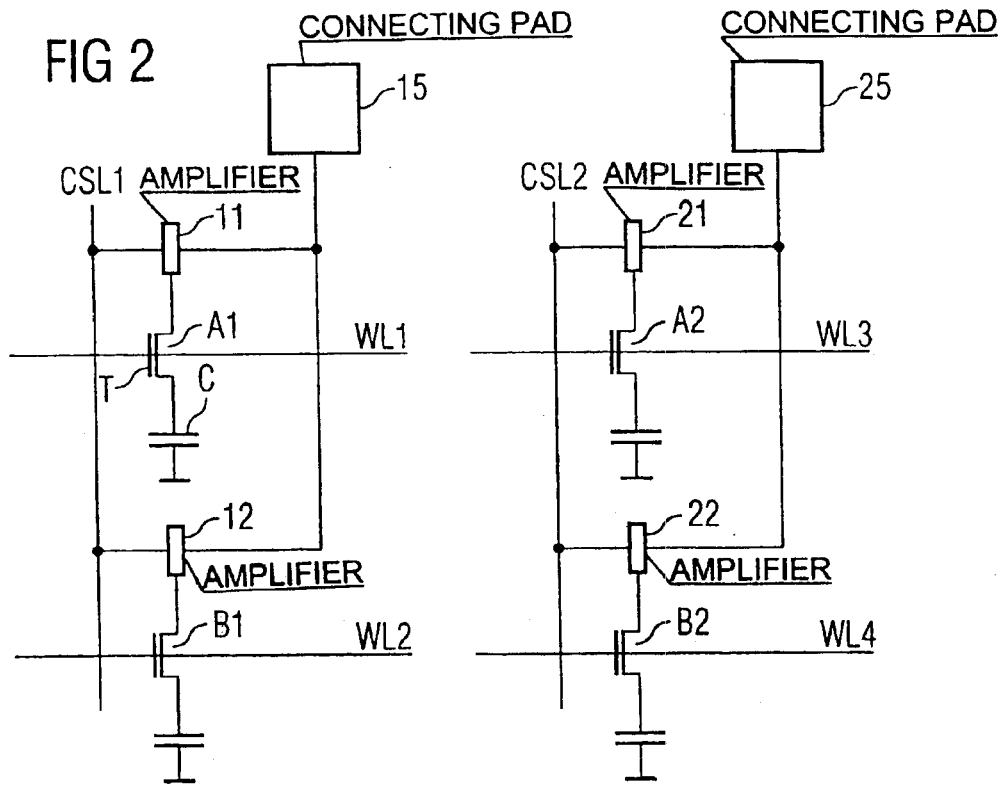
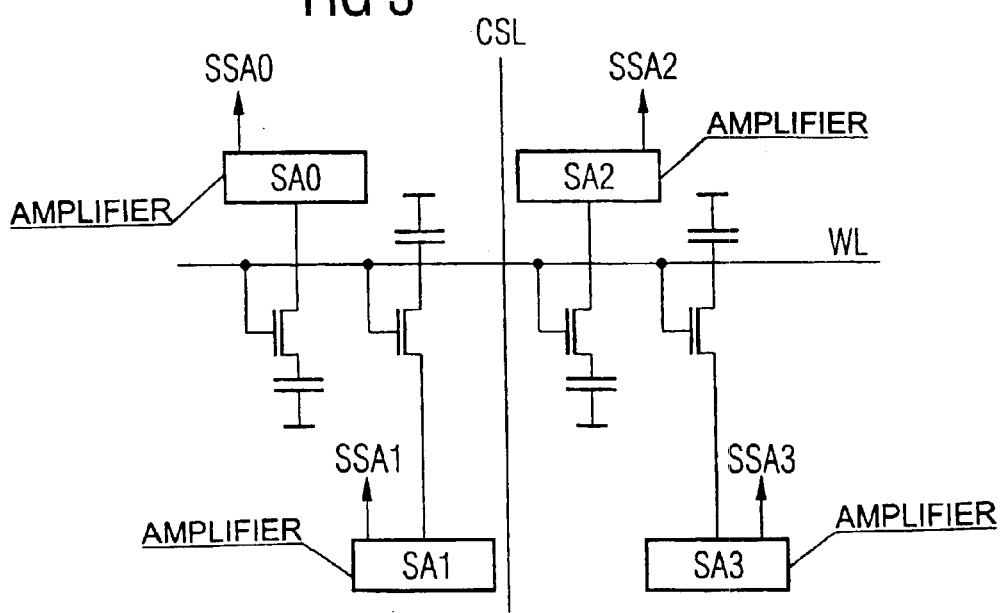

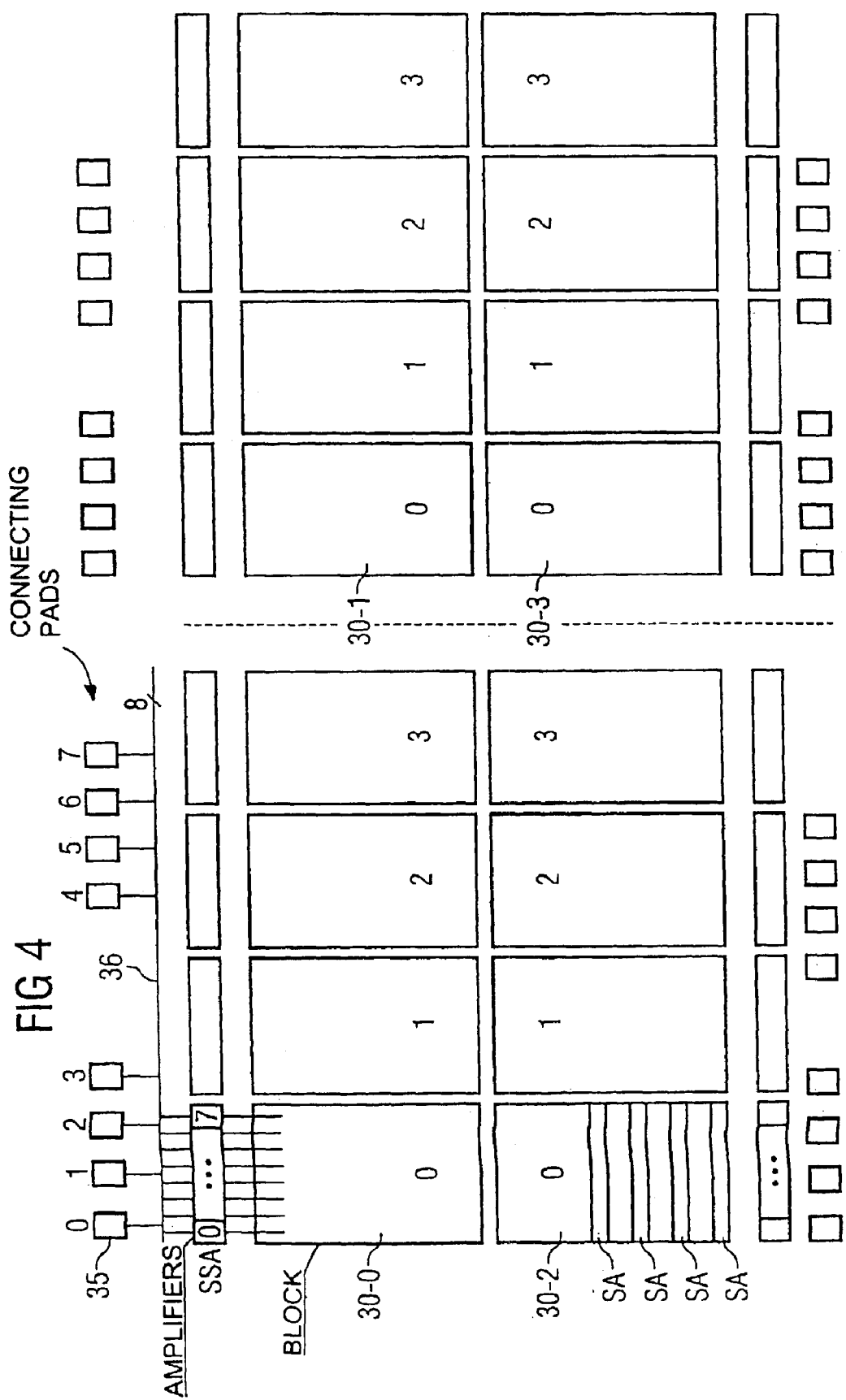

INTEGRATED MEMORY, AND A METHOD OF OPERATING AN INTEGRATED MEMORY

BACKGROUND OF THE INVENTION

Field of the Invention

The present invention relates to an integrated memory having a memory cell array with row lines for selecting memory cells, column lines for reading or writing data signals via associated read/write amplifiers, and column selection lines for activating the read/write amplifiers. In each case a group of a predetermined number of memory cells belongs to a row and column address. The memory has a number of connecting pads, which correspond to the predetermined number, for inputting and outputting the data signals that are stored in the memory cells. Each memory cell in a group of memory cells is associated with one of the connecting pads.

An integrated memory in general has a memory cell array composed of row lines and column lines. The memory cells are arranged at crossing points between the row and column lines. The memory cells are in each case connected to one of the column lines via a selection transistor, whose control input is connected to one of the row lines, via which column line a data signal is read or is written. A row line selects corresponding selection transistors, with these being opened. If the respective selection transistor is open, then the charge that is stored in the cell capacitor can pass to the corresponding column line, and from there to a read/write amplifier. A number of local read/write amplifiers are opened via column selection lines, and are associated with the cells in one selected column line.

Especially in graphics memory chips, only one bit is not normally stored at a complete address, that is to say at a row and column address, but rather a number of bits are stored, for example 32 bits. Normal organizations for graphic memories at the moment are so-called x16 and x32 organizations. Additionally, x4, x8 and x16 organizations are normal for main memories used by a processor. A corresponding number of connecting pads are then provided on the memory chip for reading or writing the data bits, and these connecting pads are uniquely associated with data bits that are stored at a row/column address. The data bits that are associated with a row/column address are normally arranged in the immediate vicinity of one another on the chip layout.

Particularly for applications such as these, it is known, for example, for two read/write amplifiers in each case to be driven by one column selection line. Two row lines or word lines are coupled and are associated with the same row address. Two of the memory cells contain data associated with a row/column address. For a memory access, the column selection line is active and drives the two read/write amplifiers. In this way, two data bits, which are associated with one row/column address, are amplified. The column selection lines are in general permanently coupled to one column address.

Since the area of the connecting pads is considerably larger than the area of a memory cell, one problem that occurs in this case is that the signal lines and hence the signal delay times are very long for some of the data bits. The signal delay time for the data bit that is furthest away in this case governs the total access time for the data word stored at that row/column address.

SUMMARY OF THE INVENTION

It is accordingly an object of the invention to provide an integrated memory and a method for operating the integrated memory which overcomes the above-mentioned disadvantages of the prior art apparatus and methods of this general type.

In particular, it is an object of the invention to provide an integrated memory in which the delay times and line lengths on the memory chip can be reduced in size.

With the foregoing and other objects in view there is provided, in accordance with the invention, an integrated memory including a memory cell array having: a plurality of memory cells, a plurality of read/write amplifiers, a plurality of row lines for selecting ones of the plurality of the memory cells, a plurality of column lines for reading or writing data signals via associated ones of the plurality of the read/write amplifiers, and a plurality of column selection lines for activating the plurality of the read/write amplifiers. A group of a predetermined number of the plurality of the memory cells belongs to a row and a column address. The integrated memory also includes a plurality of connecting pads present in a number corresponding to the predetermined number. The plurality of the connecting pads for inputting and outputting data signals is stored in the plurality of the memory cells. Each memory cell in the group of the predetermined number of the plurality of the memory cells is associated with one of the plurality of the connecting pads. The integrated memory also includes a control circuit for controlling memory access to the plurality of the memory cells. The control circuit is designed to activate at least two different ones of the plurality of the column selection lines response to a column address. The control circuit is designed to activate one of the plurality of the column selection lines for at least two column addresses.

In accordance with an added feature of the invention, the two different ones of the plurality of the column selection lines that are activated in response to the column address are configured relative to the plurality of the connecting pads such that essentially the same signal delay time is obtained between each respective activated one of the plurality of the memory cells and an associated one of the plurality of the connecting pads.

In accordance with an additional feature of the invention, the two different ones of the plurality of the column selection lines that are activated in response to the column address are configured relative to the plurality of the connecting pads such that essentially the same signal delay time is obtained between each memory cell in the group of the predetermined number of the plurality of the memory cells and an associated one of the plurality of the connecting pads.

In accordance with another feature of the invention, the memory cell array is organized in a plurality of memory banks. Various ones of the plurality of the column selection lines that are activated by a column address are configured in different ones of the plurality of the memory banks.

In accordance with a further feature of the invention, a read/write bus is provided for passing data signals from a group of the plurality of the memory cells to associated ones of the plurality of the connecting pads.

In accordance with a further added feature of the invention, the predetermined number of the plurality of the memory cells in the group is 2, 4, 8, 16, 32 or 64.

With the foregoing and other objects in view there is provided, in accordance with the invention, a method for operating the described integrated memory. The method includes steps of: providing a row address and a column address to access a group of a predetermined number of memory cells in a memory cell array; opening a row line corresponding to the row address; activating at least two different column selection lines for the column address; and passing data signals, which are read, via read/write amplifiers to associated connecting pads.

In accordance with an added mode of the invention, the method includes: for performing a read access, reading a number of given data signals corresponding to the predetermined number by performing the step of activating at least the two different column selection lines, and subsequently suppressing some data signals so that only the number of the given data signals corresponding to the predetermined number are passed to the associated connecting pads.

In accordance with an additional mode of the invention, the method includes: for performing a read access: reading given data signals associated with a plurality of column addresses that are read successively, concurrently activating column selection lines associated with the plurality of the column addresses, and externally passing the given data signals in a first plurality of cycles.

In accordance with another mode of the invention, the method includes: for performing a read access, reading given data signals associated with two or four column addresses that are read successively, and concurrently activating two or four column selection lines associated with the column addresses, and externally passing the given data signals in two or four cycles.

In accordance with a further mode of the invention, the method includes: for performing a write access, transferring groups of data signals in each of a plurality of cycles to the integrated memory, and concurrently writing the groups of the data signals to memory cells in the memory cell array after passing through the plurality of the cycles.

According to the invention, the control circuit of the integrated memory, which is used for controlling a memory access to the memory cells, is designed and can be operated such that, for a column address, it activates at least two different column selection lines, and one of the column selection lines for two or more column addresses.

The invention is thus based on the idea of no longer permanently coupling the column selection lines to one column address, but of activating one column selection line for two or more column addresses. In consequence, the data bits that are associated with one of the column addresses can be stored, at different locations on the memory chip. This capability thus offers the advantage that the delay time can be matched and minimized, since data bits can be stored as close as possible to the I/O circuits on the chip.

Accordingly, in one embodiment of the invention, in order to match the delay times, the column selection lines which are activated by one column address are arranged relative to the connecting pads so as to achieve essentially the same signal delay time between the respective memory cells in the group of memory cells and the respectively associated connecting pad.

In one preferred refinement, the memory cell array of the integrated memory is organized in memory banks, and the various column selection lines which are activated for one column address are arranged in different memory banks.

In a further preferred refinement, the data signals are passed from one group of memory cells via a read/write bus to the associated connecting pads.

The stated predetermined number of memory cells in a group of memory cells is, for example, 2, 4, 8, 16, 32 or 64.

Since the locations at which the read/write amplifiers for a word are placed are distributed more widely over the chip than in conventional configurations, it is also simpler to provide the supply voltage for these circuits.

Since data that is associated with a different column address is also read together with the data which is associated with one column address, too many data bits are actually read. If this is a memory chip in which, for a read access, a number of data bits corresponding to the predetermined number are read from the memory cell array, for example 32 data bits when 32 data bits are stored in each row/column address, then the excess data bits are expediently suppressed during reading. On the other hand, when writing the data bits, care is taken to ensure that the information is written to the correct cells, and that information in other cells is not overwritten.

In other architectures, in the event of a read access from the memory cell array, in which the data bits, associated with a number of successively read column addresses, are read (so-called prefetch architecture), the problem of needing to suppress data bits no longer occurs. In this case, the column decoder, which produces the association between the column address and the column selection lines, is expediently designed such that the two or more column addresses that are associated with one column selection line are also part of the address,area that is read in an access from the memory cell array.

By way of example, in a so-called Prefetch 2 memory, that is to say a memory in which the data from two successive column addresses is read simultaneously from the memory cell array, the column address 1 is automatically read in the next cycle after requesting the column address 0. In the case of read accesses, the data for both column addresses is read from the cell array, and is then emitted to the exterior in two cycles. In the event of a write access, the data for the column address 0 is transferred to the memory in a first cycle, and the data for the column address 1 is transferred in a second cycle. When both data packets have been received by the chip, they are written to the cell array at the same time. The invention now allows the coupling of the two adjacent column addresses, such as the column address 0 and the column address 1, to a single column selection line.

This may be achieved, for example, by the least significant column address bit no longer being included in the column decoding. This has the additional advantage that the column decoder becomes smaller and faster. In addition, the previous advantage is still maintained—the locations at which the data bits associated with one address are stored, are distributed between a number of points in the chip. This results in shorter delay times and hence higher speeds for the entire memory.

The invention can be used in general for memories using all the organizations mentioned in the introduction, in particular for DRAM memories such as in x2 organization or higher.

Other features which are considered as characteristic for the invention are set forth in the appended claims.

Although the invention is illustrated and described herein as embodied in an integrated memory, and a method of operating an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic illustration of an integrated memory with components for memory access;

FIG. 2 shows a detail from the memory cell array in order to illustrate the invention;

FIG. 3 shows a detail from a memory cell array according to a further exemplary embodiment of the invention; and FIG. 4 shows the layout of an integrated memory according to another exemplary embodiment of the invention.

DESCRIPTION OF THE PREFERRED EMBODIMENTS

Referring now to the figures of the drawing in detail and first, particularly, to FIG. 1 thereof, there is shown in a highly schematic form, an exemplary embodiment of an integrated memory 1. The memory 1 has a memory cell array 2, which contains row lines WL and column lines BL. The memory cells MC are arranged at the crossing points of the row lines and column lines and are each connected to one of the row lines and to one of the column lines. Each memory cell contains, in a known manner, a selection transistor and a cell capacitor, which are not shown for the sake of simplicity.

In the architecture of the memory 1, eight data bits are stored at each row/column address. The data bits are read or written via eight connecting pads 5, which are connected to the memory cell array 2 via a read/write bus 6 and data lines DQ.

The appropriate row and column lines for memory access are selected in a known manner via a row decoder 3 and a column decoder 4. The memory access is in this case controlled by a control circuit 7, in which all the components required for this purpose are combined, and which receives address signals ADR and control signals CTRL.

The association of column addresses and column selection lines according to the invention is illustrated in the form of an example in FIG. 2. There, two read/write amplifiers 11, 12 and 21, 22 are respectively controlled by one column selection line CSL1 or CSL2. The row lines WL1 and WL2 as well as WL3 and WL4 are in each case coupled and are associated with the same row address. The column selection line CSL1 is not permanently coupled to one column address, but is activated for two column addresses A and B. In the same way, the column selection line CSL2 is activated for two column addresses A and B. The read/write amplifiers 11 or 12 are connected to the first connecting pad 15, and the read/write amplifiers 21, 22 are connected to the second connecting pad 25.

In the simplified illustration in FIG. 2, two data bits are stored at each row/column address, using in each case one memory cell with one selection transistor T and one memory capacitor C. Since both the column selection line CSL1 and the column selection line CSL2 are activated for the column address A, the two bits A1 and A2 which are associated with the column address A can be stored at different points in the chip. The same is true for the two bits B1 and B2 that are associated with the column address B. Thus, as is illustrated in FIG. 2, the respective first bits for the column address A and B are arranged close to the first connecting pad 15, and the second bits for the column address A and B are arranged close to the second connecting pad 25. Thus, overall, this results in matched and shorter signal paths and signal delay times than in the conventional configuration.

FIG. 3 shows a detail from a memory cell array of an integrated memory in which a number of data bits are stored in each row/column address. The activation of the row line WL opens four selection transistors, and the stored charges flow to the column lines for the read/write amplifiers SA0 to SA3. If the column is now activated by the column selection line CSL, the local read/write amplifiers SA0 to SA3 are opened, and the amplified charges:flow to second read/write amplifiers SSA0 to SSA3. Further subgroups of memory cells which are associated with the same column address may be arranged at other points in the cell array so that a total of 16 data bits, for example, are associated with one row/column address, and are distributed in subgroups of four memory cells between four data banks.

FIG. 4 shows the layout of an integrated memory according to the invention. There, 32 data bits are stored at one row/column address, and according to the invention, are split into four subgroups of eight bits each. This is reflected in FIG. 4 by the arrangement of the connecting pads 35, which are organized in four groups of eight connecting pads each.

Only the subgroup in the left-hand upper quarter of the integrated memory will be considered in more detail in the following text. The other areas are constructed in an analogous manner to this. The four blocks which are annotated 30-0, 30-1, 30-2 and 30-3 together form a memory bank. Eight bits of the 32-bit long data word which is associated with one row/column address are stored in each of the blocks. In this case, the bits 0 to 7 are stored in the block 30-0, bits 8 to 15 in the block 30-1, the bits 16 to 23 in the block 30-2 and the bits 24 to 31 in the block 30-3. In this embodiment, after the application of a column address, column selection lines are activated in all four blocks, and the eight bits that are stored in each block and are associated with this column address are passed to the appropriate connecting pads.

The splitting of the 32 bits into four groups of eight bits, which are each arranged close to the associated connecting pads, makes it possible to achieve clear matching and shortening of the signal paths and of the signal delay time. After activating a column selection line, as explained in conjunction with FIG. 3, the eight local read/write amplifiers associated with the eight bits are opened in the block 30-0, as a result of which the stored data bits are passed to the further read/write amplifiers SSA0 to SSA7. From there, the data bits are passed to the read/write bus 36, which passes them to the appropriate connecting pads.

Overall, the invention offers the capability to match and to reduce the delay times and line lengths on memory chips, in that the data bits which are associated with one row/column address are stored close to the respective I/O circuits. To do this, one cannot store all of the data bits which are associated with one data word at the same location, but rather one must distribute them between different locations in the memory cell array. This is achieved by no longer permanently associating one column selection line and one column address, and by associating a number of column addresses and one column selection line.

We claim:

1. An integrated memory, comprising:
   a memory cell array having:
      a plurality of memory cells, a plurality of read/write amplifiers, a plurality of row lines for selecting ones of said plurality of said memory cells, a plurality of column lines for reading or writing data signals via associated ones of said plurality of said read/write amplifiers, and a plurality of column selection lines for activating said plurality of said read/write amplifiers, a group of a predetermined number of said plurality of said memory cells belonging to a row and a column address;

a plurality of connecting pads present in a number corresponding to the predetermined number, said plurality of said connecting pads for inputting and outputting data signals being stored in said plurality of said memory cells, each memory cell in said group of said predetermined number of said plurality of said memory cells being associated with one of said plurality of said connecting pads; and a control circuit for controlling memory access to said plurality of said memory cells;

said control circuit being designed to activate at least two different ones of said plurality of said column selection lines in response to a column address; and said control circuit being designed to activate one of said plurality of said column selection lines for at least two column addresses.

2. The integrated memory according to claim 1, wherein said two different ones of said plurality of said column selection lines that are activated in response to the column address are configured relative to said plurality of said connecting pads such that essentially a same signal delay time is obtained between each respective activated one of said plurality of said memory cells and an associated one of said plurality of said connecting pads.

3. The integrated memory according to claim 1, wherein said two different ones of said plurality of said column selection lines that are activated in response to the column address are configured relative to said plurality of said connecting pads such that essentially a same signal delay time is obtained between each memory cell in said group of said predetermined number of said plurality of said memory cells and an associated one of said plurality of said connecting pads.

4. The integrated memory according to claim 1, wherein:
said memory cell array is organized in a plurality of memory banks; and
various ones of said plurality of said column selection lines that are activated by a column address are configured in different ones of said plurality of said memory banks.

5. The integrated memory according to claim 1, comprising a read/write bus for passing data signals from a group of said plurality of said memory cells to associated ones of said plurality of said connecting pads.

6. The integrated memory according to claim 1, wherein the predetermined number of said plurality of said memory cells in said group is 2, 4, 8, 16, 32 or 64.

7. A method for operating an integrated memory, which comprises:
providing a plurality of column selection lines for activating a plurality of read/write amplifiers;
providing a row address and a column address to access a group of a predetermined number of memory cells in a memory cell array;
opening a row line corresponding to the row address;
activating at least two different column selection lines for the column address;
activating one of the plurality of column selection lines for at least two column addresses; and
passing data signals, which are read, via read/write amplifiers to associated connecting pads.

8. The method according to claim 7, which comprises: for performing a read access, reading a number of given data signals corresponding to the predetermined number by performing the step of activating at least the two different column selection lines, and subsequently suppressing some data signals so that only the number of the given data signals corresponding to the predetermined number are passed to the associated connecting pads.

9. The method according to claim 7, which comprises: for performing a read access: reading given data signals associated with a plurality of column addresses that are read successively, concurrently activating column selection lines associated with the plurality of the column addresses, and externally passing the given data signals in a first plurality of cycles.

10. The method according to claim 9, which comprises: for performing a write access, transferring groups of data signals in each of a second plurality of cycles to the integrated memory, and concurrently writing the groups of the data signals to memory cells in the memory cell array after passing through the second plurality of the cycles.

11. The method according to claim 7, which comprises: for performing a read access, reading given data signals associated with two or four column addresses that are read successively, and concurrently activating two or four column selection lines associated with the column addresses, and externally passing the given data signals in two or four cycles.

12. The method according to claim 11, which comprises: for performing a write access, transferring groups of data signals in each of a plurality of cycles to the integrated memory, and concurrently writing the groups of the data signals to memory cells in the memory cell array after passing through the plurality of the cycles.

* * * * *